United States Patent

Cohen et al.

[11] Patent Number: 5,885,095
[45] Date of Patent: Mar. 23, 1999

[54] ELECTRICAL CONNECTOR ASSEMBLY WITH MOUNTING HARDWARE AND PROTECTIVE COVER

[75] Inventors: Thomas S. Cohen, New Boston, N.H.; Philip T. Stokoe, Attleboro, Mass.; Steven J. Allen, Nashua, N.H.

[73] Assignee: Teradyne, Inc., Boston, Mass.

[21] Appl. No.: 654,409

[22] Filed: May 28, 1996

[51] Int. Cl.[6] .................................................. H01R 13/44
[52] U.S. Cl. ............................................. 439/138; 439/327
[58] Field of Search ............................ 439/65, 136, 137, 439/138, 142, 144, 327, 632, 61, 377

[56] References Cited

U.S. PATENT DOCUMENTS

| | | | |
|---|---|---|---|
| 4,779,950 | 10/1988 | Williams | 350/96.21 |
| 4,787,706 | 11/1988 | Cannon et al. | 350/96.2 |
| 4,834,660 | 5/1989 | Cotti | 439/67 |
| 4,869,680 | 9/1989 | Yamamoto et al. | 439/327 |
| 4,914,552 | 4/1990 | Kecmer | 361/801 |
| 5,350,309 | 9/1994 | Abukawa et al. | 439/138 |
| 5,385,490 | 1/1995 | Demeter et al. | 439/579 |
| 5,398,164 | 3/1995 | Goodman et al. | 439/377 |
| 5,413,510 | 5/1995 | Taylor | 439/138 |
| 5,571,023 | 11/1996 | Anthony | 439/144 |
| 5,597,317 | 1/1997 | Hansell, III et al. | 429/289 |
| 5,650,917 | 7/1997 | Hsu | 439/327 |

FOREIGN PATENT DOCUMENTS 0 175 788 B1  3/1991  European Pat. Off. .

*Primary Examiner*—Hien Vu
*Assistant Examiner*—Katrina Davis
*Attorney, Agent, or Firm*—Richard E. Gamache

[57] ABSTRACT

An electrical connector assembly used with a daughter board and a back plane that protects the daughter board and the electrical connectors from damage during use. The assembly includes mounting hardware that is attached to the daughter board to prevent it from bending when a high insertion force is used to plug the daughter board onto the back plane. The mounting hardware also prevents the electrical connectors from damage by distributing the insertion force evenly across the connectors. The assembly also includes a protective cover that is attached to the electrical connectors. The protective cover encloses the signal contacts of the electrical connectors that are attached to the daughter board, and swings away automatically to expose the signal contacts when the daughter board is plugged onto the back plane.

7 Claims, 4 Drawing Sheets

ELECTRICAL CONNECTOR ASSEMBLY WITH MOUNTING HARDWARE AND PROTECTIVE COVER

This invention relates generally to connectors for routing signals between printed circuit boards and more particularly to high speed and high density connectors.

Electrical connectors are widely used in modern electronic equipment to connect the signal paths between two or more printed circuit boards. Sometimes printed circuit boards are connected together through a "back plane." Connectors for this application are generally made in two pieces, and are easily mated or unmated. Such connectors make the assembly and maintenance of electronic equipment easier. The printed circuit boards connected to or "plugged onto" the back plane in this fashion are called "daughter boards."

Typically, electrical connectors include two plastic housings. One plastic housing is mounted to the back plane, and the other plastic housing is mounted to the daughter board. Each housing has numerous conductive contacts in it. When the two pieces of a connector are mated, the conductive contacts in each housing touch, thereby making electrical contact. Usually some sort of spring force is used to keep the contacts together. Alternatively, some connectors have one set of contacts shaped as pins, and another set of contacts shaped as receptacles into which the pins can be inserted. However, other types of contacts have been used, such as fork and blade contacts.

Ordinarily, two piece connectors contain many rows of contacts. The contacts generally have tails that extend from the housings and attach to either the daughter board or the back plane. In this way, numerous signals can be carried between the daughter board and the back plane.

In one configuration, the electrical connectors used to couple the daughter board to the back plane may require a low insertion force. An example of such an electrical connector is the surface mount connector described in U.S. patent application Ser. No. 08/454,898, filed May 31, 1995, which is hereby incorporated by reference. For the surface mount connector, the signal contacts in the housing mounted to the daughter board are generally bent to form contact springs. Further, the signal contacts make direct contact to the signal pads on the back plane when the daughter board is plugged onto the back plane.

However, the signal contacts in this configuration are generally very small and fragile. As a result, they may be damaged if they are inadvertently touched. Further, if the daughter board is not properly aligned with the back plane when connection is being made, the tiny and fragile signal contacts may be damaged or broken. Consequently, signals from the daughter board may not be properly routed to the back plane, and electronic equipment failure may result.

In another configuration, the electrical connectors used to couple the daughter board to the back plane may require a high insertion force. Further, levers may be provided to generate the force required to plug the daughter board onto the back plane.

However, the application of a high insertion force on the daughter board may result in an uneven distribution of force across the electrical connectors. This is likely to occur when multiple electrical connectors are used to couple the daughter board to the back plane. Consequently, the connector portions may not be properly aligned when connection is being made, and the electrical connectors may be damaged.

In addition, the application of a high insertion force may cause the daughter board to bend. As a result, the solder joints connecting electronic components to the daughter board may become damaged after repeated joining and separating of the daughter board and the back plane.

Although electrical connectors have been used successfully to connect signal paths between multiple printed circuit boards, it would be desirable to have an electrical connector assembly that prevents damage to the electrical connectors when a printed circuit board is repeatably joined with and separated from another printed circuit board. It would also be desirable to have an electrical connector assembly that prevents a printed circuit board from bending when a high insertion force is used to join the printed circuit board with another printed circuit board. Such an electrical connector assembly should also permit multiple printed circuit boards to be joined and separated easily during use.

SUMMARY OF THE INVENTION

With the foregoing background in mind, it is an object of the invention to provide an electrical connector assembly that supports high speed and high density electrical connectors.

It is also an object to provide an electrical connector assembly that allows repeated mating and unmating of electrical connectors without damaging the tiny and fragile electrical contacts required for high speed and high density applications.

It is also an object to provide an electrical connector assembly that allows repeated joining and separating of printed circuit boards without bending or otherwise damaging the printed circuit boards.

The foregoing and other objects are achieved in an electrical connector assembly having robust packaging. According to one feature, the electrical connector assembly includes a cover that attaches to the high speed and high density electrical connector, and encloses the tiny and fragile signal contacts in the electrical connector. The cover is also movable such that it slides away automatically to expose the signal contacts when the printed circuit board is plugged into another printed circuit board, and slides back to its original position when the printed circuit board is unplugged from another printed circuit board.

According to another feature, the electrical connector assembly is used on a printed circuit board that has a stiffener and load transfer members. The stiffener attaches across the printed circuit board adjacent and parallel to the edge where the electrical connectors are attached. In a preferred embodiment, the load transfer members are attached to the printed circuit board perpendicular to the stiffener. When the printed circuit board is plugged into another printed circuit board, the load transfer members press on the stiffener which evenly distributes the force to the electrical connectors.

According to still another feature, the load transfer members include force generating mechanisms. In a preferred embodiment, locking levers provide most of the force required to plug the printed circuit board into another printed circuit board, and screws provide the remaining force needed to seat the electrical connectors.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 a printed circuit board incorporating the invention.

DESCRIPTION OF THE PREFERRED EMBODIMENT

Figure 1:
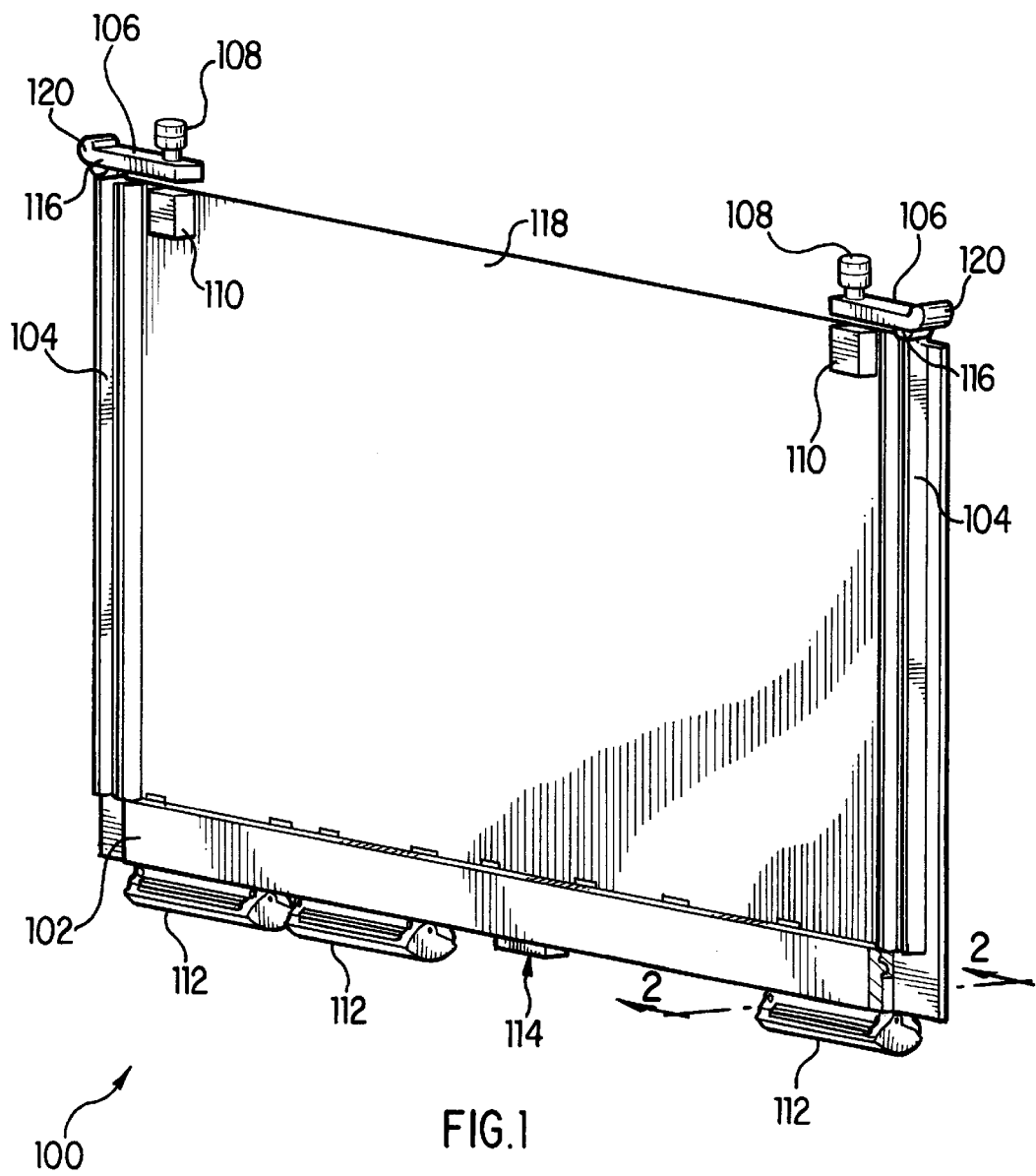

FIG. 1 shows a preferred embodiment of the electrical connector assembly of the present invention. Surface mount connectors 112 and pin and socket connector 114 are attached to the bottom edge of printed circuit board 118. Such a printed circuit board is sometimes called a "daughter board."

Stiffener 102 is attached to printed circuit board 118, adjacent and parallel to the bottom edge. Stiffener 102 is a strip of metal that has a length approximately equal to the width of printed circuit board 118. Further, the width and thickness of stiffener 102 is sufficient to prevent printed circuit board 118 from bending when it is plugged onto the back plane (not shown).

Two load transfer members 104 are also attached to the back side of printed circuit board 118. Load transfer members 104 are made of metal, and are positioned adjacent and parallel to the left and right side edges of printed circuit board 118, respectively. In a preferred embodiment, load transfer members 104 each have three sides which form an open channel that extends downward from the top edge of printed circuit board 118 to stiffener 102. This configuration makes load transfer members 104 very rigid. Further, load transfer members 104 are perpendicular to, and make physical contact with, stiffener 102.

Fulcrum 116 is attached to the respective ends of load transfer members 104, adjacent to the top edge of printed circuit board 118. Fulcrum 116 is the support about which locking lever 106 turns. Screws 108 are placed through holes in locking levers 106 and engage receptacles 110 attached to printed circuit board 118.

In a preferred embodiment, connectors 112 and 114, printed circuit board 118, and the back plane are part of a card cage system (not shown). Card cage systems generally have guide rails to ensure that the daughter boards are properly aligned with the connectors on the back plane. When printed circuit board 118 is part of a card cage system, locking levers 106, screws 108, and receptacles 110 can be used to hold printed circuit board 118 in place.

Locking levers 106 can also be used to generate the high insertion force required to press pin and socket connector 114 against the back plane. When printed circuit board 118 is part of a card cage system, locking levers 106 can be turned simultaneously on fulcrum 116 so that a downward force is applied to load transfer members 104. The applied force is then transferred to stiffener 102 at the points where load transfer members 104 touch stiffener 102. As a result, stiffener 102 distributes the applied force to pin and socket connector 114. Because the applied force is evenly distributed across stiffener 102, electrical connectors with different insertion force requirements, such as pin and socket connector 114 and surface mount connectors 112, can be mounted on printed circuit board 118 and plugged onto the back plane simultaneously. Further, the rigidity of load transfer members 104 and stiffener 102 prevents printed circuit board 118 from bending when a high insertion force is used to plug printed circuit board 118 onto the back plane. As a result, damage to both printed circuit board 118 and the solder joints connecting electronic components to printed circuit board 118 is minimized.

Most of the motion required to plug pin and socket connector 114 onto the back plane is caused by applying force to locking levers 106, as in the prior art. The final amount of motion required to seat pin and socket connector 114 is provided by turning screws 108. In the preferred embodiment, screws 108 provide about 0.050" of motion. Additionally, screws 108 provide the force necessary to lock down the signal contacts of surface mount connectors 112 against the signal pads on the surface of the back plane.

Additionally, locking levers 106 can be used to generate the force required to unplug pin and socket connector 114 from the back plane. For example, in order to unplug printed circuit board 118 from the back plane, screws 108 are first disengaged from their respective receptacles 110. In a preferred embodiment, locking levers 106 have upturned portions 120 that extend slightly beyond the side edges of printed circuit board 118. When printed circuit board 118 is part of a card cage system, locking levers 106 can be turned simultaneously on fulcrum 116 so that upturned portions 120 apply a downward force to the guide rails of the card cage. As a result, an upward force is applied to printed circuit board 118 at the points where fulcrums 116 are attached to load transfer members 104. In this way, locking levers 106 can generate an upward force sufficient to unplug pin and socket connector 114 from the back plane.

Figure 2:
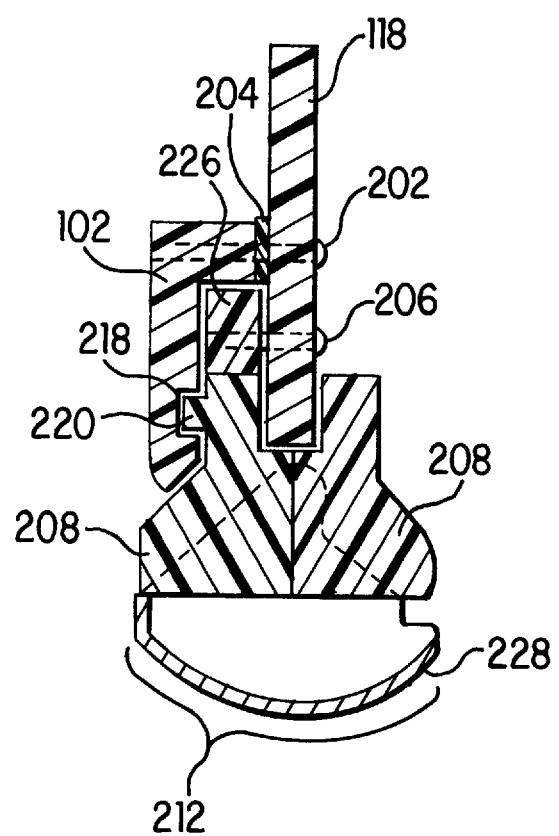
FIG. 2 shows in cross-section the interconnection of the daughter board, the stiffener, and the surface mount connector.

FIG. 2 shows printed circuit board 118, stiffener 102, and surface mount connector 112 in cross-section. Screws 202 are placed through holes in printed circuit board 118 and spacer 204, and engage stiffener 102, to secure both spacer 204 and stiffener 102 to printed circuit board 118. Spacer 204 extends along the full length of stiffener 102. Because spacer 204 is made of an insulative material, stiffener 102 is isolated from any conductive solder joints that may be located on the back side of printed circuit board 118. Further, screws 202 are evenly spaced along the full length of both spacer 204 and stiffener 102.

Surface mount connector 112 has two halves which are identical in the preferred embodiment. The two halves of surface mount connector 112 are held together by screws, rivets, or by any other convenient means (not shown). Each half of surface mount connector 112 contains housing 208. Housings 208 are made of an insulative material, preferably injection molded from plastic or polyester. Additionally, housings 208 contain mounting tabs 226 (see also FIG. 3). Screws 206 pass through holes in printed circuit board 118, and engage mounting tabs 226, to secure surface mount connector 112 to printed circuit board 118. Housing 208 also has tab 220 projecting toward stiffener 102 along the full length of surface mount connector 112. Tab 220 fits into slot 218 in stiffener 102 to ensure proper alignment of housing 208 and stiffener 102. Surface mount connector 112 also includes protective cover 212. Such a surface mount connector, not including protective cover 212, is described in patent application Ser. No. 08/454,898, filed May 31, 1995.

Figure 3:
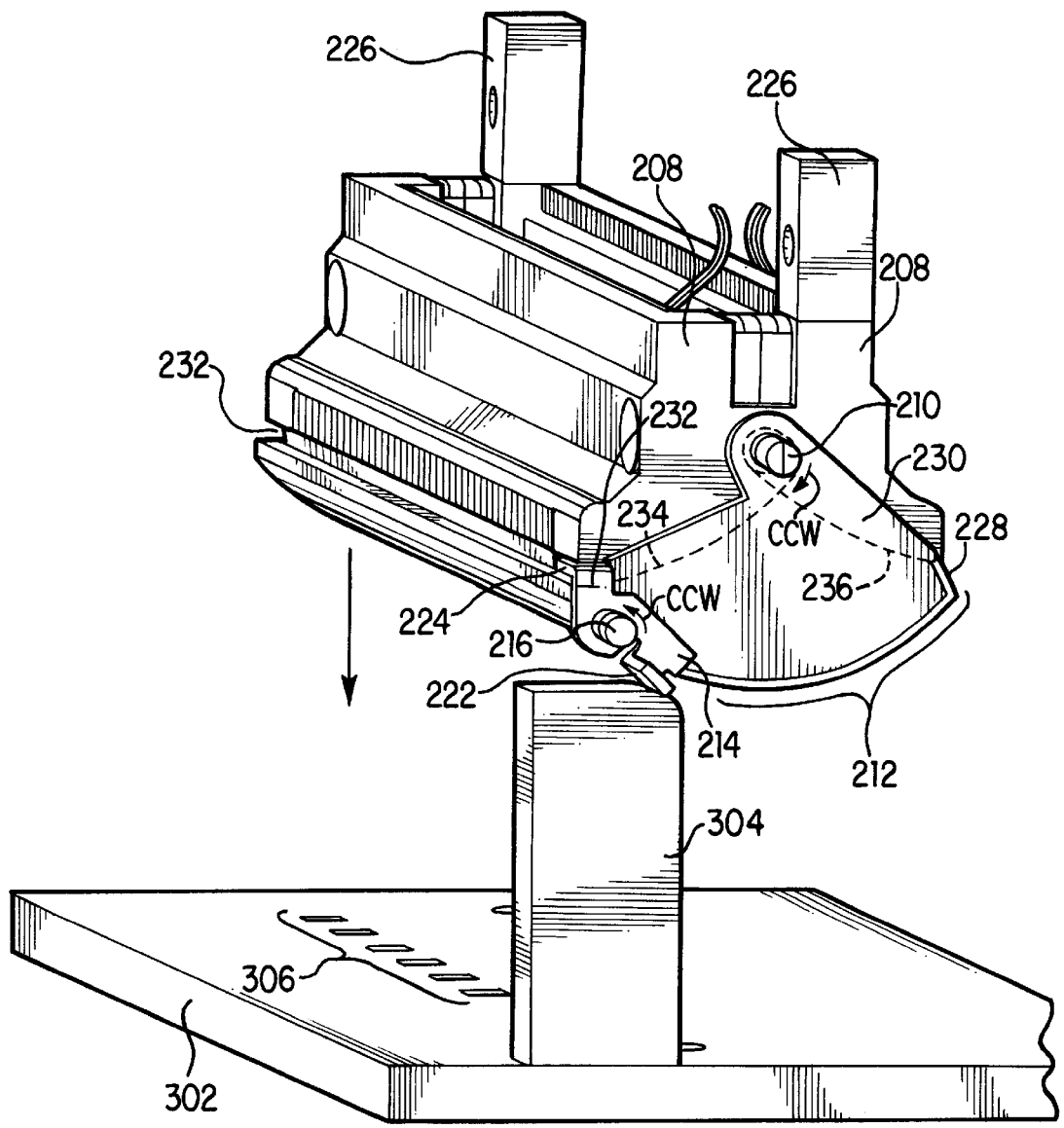
FIG. 3 shows the movable, protective cover of the surface mount connector.

Turning to FIG. 3, protective cover 212 is described in greater detail. Protective cover 212 has face 228 and one side 230 adjacent to each end of housing 208. One pivot 210 is attached to each end of housing 208. Pivots 210 have a common axis of symmetry, and are seated in holes in sides 230, thereby coupling protective cover 212 to housing 208.

Additionally, the radial distance from the common axis of symmetry to face 228 is sufficient to prevent face 228 from striking housing 208 when protective cover 212 rotates about pivots 210.

Surface mount connector 112 has signal contacts (not shown) disposed in housing 208. Further, the surface of back plane 302 has signal pads 306. The signal contacts are generally very small and fragile. As a result, the signal contacts are easily damaged if they are inadvertently touched, or if printed circuit board 118 is not properly aligned with back plane 302 when connection is being made to signal pads 306.

Protective cover 212 also includes arm 214, clutch spring 234, and clutch spring 236. Arm 214 includes tappet 222 and latch 224. Pivot 216 is attached to one of sides 230 and extends through a hole in arm 214, thereby coupling arm 214 to side 230. Further, clutch spring 234 is connected between pivot 210 and latch 224 to bias latch 224 in a direction to urge latch 224 against side 230. Additionally, clutch spring 236 is connected between pivot 210 and face 228 to bias face 228 in a direction to urge face 228 against housing 208. When protective cover 212 is in its closed position, latch 224 engages slot 232 to fasten protective cover 212 to housing 208. Finally, back plane 302 includes vertical guides 304. There is generally one guide 304 on back plane 302 for each surface mount connector 112 on printed circuit board 118.

When printed circuit board 118 is plugged onto back plane 302, tappet 222 makes contact with guide 304, and causes arm 214 to rotate in a counter-clockwise direction about pivot 216 so as to disengage latch 224 from slot 232. The rotation of arm 214 about pivot 216 causes tension in clutch spring 234., Further, the movement of latch 224 out of slot 232 unfastens protective cover 212 from housing 208.

As printed circuit board 118 moves closer to back plane 302, arm 214 continues to rotate until pivot 216 makes contact with guide 304. Because protective cover 212 is now unfastened from housing 208, further movement of printed circuit board 118 toward back plane 302 causes protective cover 212 to rotate in a clockwise direction about pivots 210. The rotation of protective cover 212 about pivots 210 causes tension in clutch spring 236. Additionally, the height of guide 304 is sufficient to ensure that protective cover 212 is in its open position when surface mount connector 112 finally makes contact with back plane 302.

When printed circuit board 118 is unplugged from back plane 302, clutch spring 236 causes protective cover 212 to rotate about pivots 210 in a counter-clockwise direction until protective cover 212 moves to its closed position. Further movement of printed circuit board 118 away from back plane 302 causes pivot 216 to move away from guide 304. As a result, clutch spring 234 causes arm 214 to rotate about pivot 216 in a clockwise direction until latch 224 engages slot 232. Protective cover 212 is now fastened to housing 208, and is in its closed position. Consequently, the tiny and fragile signal contacts in surface mount connector 112 are exposed only when they are about to be mated with signal pads 306 on back plane 302. Otherwise, cover 212 encloses the signal contacts and protects them from accidental damage.

Having described one embodiment, numerous alternative embodiments or variations might be made. For example, the exact materials used could be varied. Also, the approximate dimensions given above are representative and could be varied.

Also, it was described that fulcrum 116 is attached to the end of load transfer member 104. Alternatively, fulcrum 116 could be attached to the top edge of printed circuit board 118.

Figure 4:
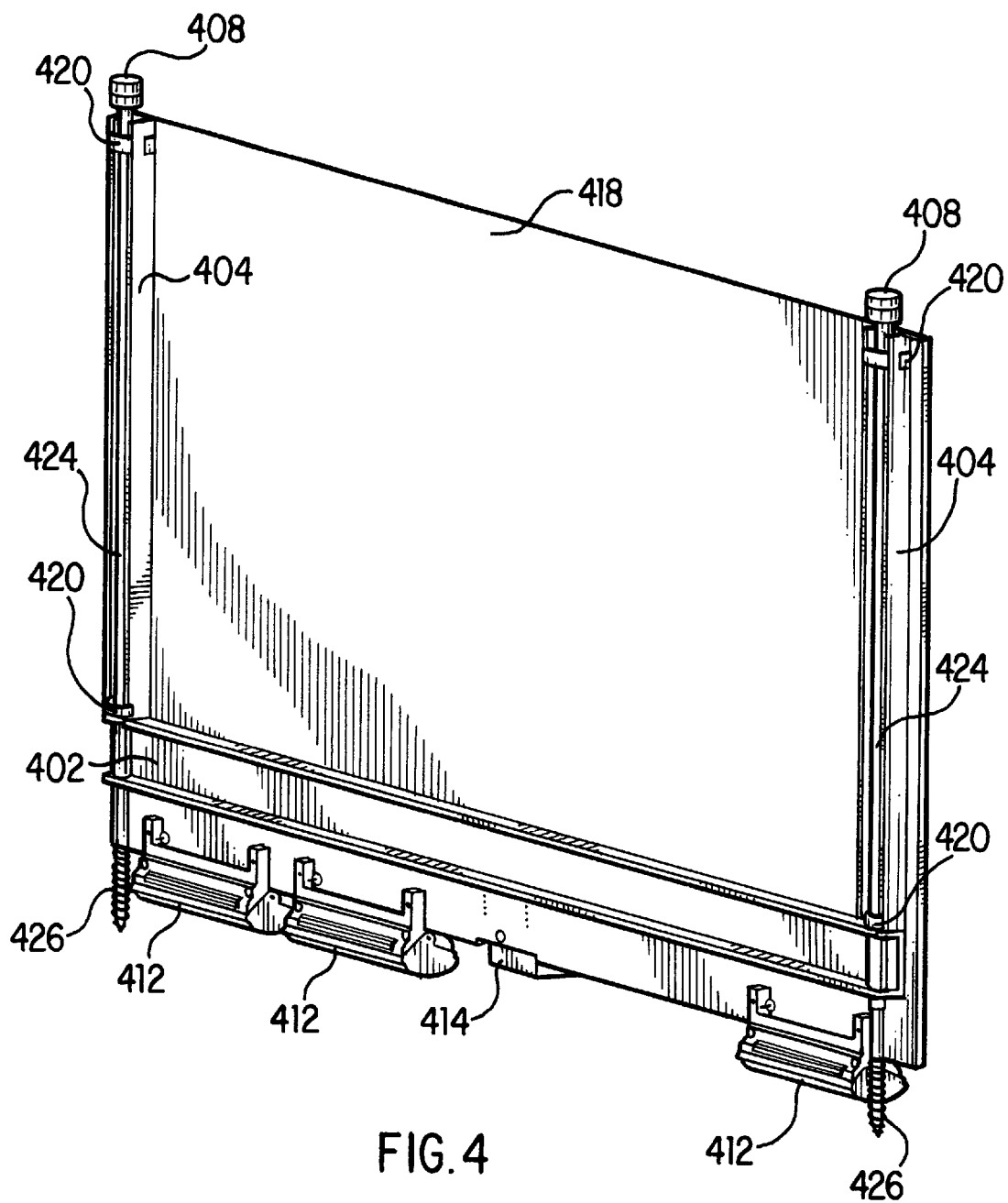
FIG. 4 shows an alternative embodiment of the invention at uses jack screws.

Also, it was described that a locking lever arrangement can be used to generate the insertion force required to press pin and socket connector 114 against back plane 302. However, FIG. 4 shows an embodiment that uses jack screws 408 between printed circuit board 418 and the card cage (not shown). Jack screws 408 can be adjusted to generate the required force independent of manufacturing tolerances on printed circuit board 418.

Stiffener 402 is attached to the back side of printed circuit board 418, adjacent and parallel to the bottom edge. Two load transfer members 404 are also attached to the back side of printed circuit board 418, adjacent and parallel to the left and right side edges of printed circuit board 418. In a preferred embodiment, load transfer members 404 each have three sides which form an open channel that extends downward from the top edge of printed circuit board 418 to stiffener 402. Further, load transfer members 404 are perpendicular to, and make contact with, stiffener 402.

Jack screws 408 include shank 424 and threads 426. One shank 424 is disposed in each of the open channels formed by load transfer members 404. Shanks 424 also pass through holes in stiffener 402. The length of shanks 424 is sufficient to ensure that threads 426 extend beyond the bottom edge of printed circuit board 418. Threads 426 engage the back plane (not shown) and have a sufficient number of turns to fully engage pin and socket connector 414 with its receptacle (not shown) on the back plane.

Further, to ensure that jack screws 408 are properly aligned with printed circuit board 418, shanks 424 pass through guides 420. One guide 420 is attached to each load transfer member 404 adjacent to the top edge of printed circuit board 418, while another guide 420 is attached to each load transfer member 404 adjacent to the point where load transfer member 404 makes contact with stiffener 402.

Also, it was described that stiffener 102 is a strip of metal. However, FIG. 4 shows stiffener 402 having three sides forming an open channel that extends across printed circuit board 418 from the left side edge to the right side edge. This configuration makes stiffener 402 very rigid.

Also, it was described that housing 208 has tab 220 which fits into slot 218 in stiffener 102 to ensure proper alignment of housing 208 and stiffener 102. However, FIG. 4 shows that stiffener 402 could be attached to printed circuit board 418 so that it does not make contact with either surface mount connectors 412 or pin and socket connector 414. Stiffener 402 can be mounted across the back side of printed circuit board 418 slightly above connectors 412 and 414.

Therefore, the invention should be limited only by the spirit and scope of the appended claims.

What is claimed is:

1. A surface mount electrical connector comprising:
   a) an insulative housing having a lower surface;
   b) a plurality of conductive members passing through the insulative housing, said conductive members having contact regions on the lower surface of the insulative housing for making electrical contact with signal pads on a back plane; said back plane having a vertical guide extending upwardly thereon
   c) a cover movably mounted to the insulative housing, the cover being mounted to enclose the contact regions when in a first position, and to expose the contact regions when moved to a second positions; and
   d) an arm movably mounted to the cover, comprising
      i) a catch mechanism for fastening the cover to the insulative housing when in the first position, and ii) a tappet being pushed by said vertical guide for allowing for causina the catch mechanism to unfasten the cover from the insulative housing, thereby allowing the cover to move to the second position.

2. The surface mount electrical connector of claim 1 further comprising:

a) a first spring connected between said insulative housing and said cover, to bias the cover in a direction to urge the cover to said first position; and b) a second spring connected between said insulative housing and said catch mechanism, to bias the catch mechanism in said direction to urge the catch mechanism against the insulative housing, whereby the position of the catch mechanism fastens the cover to the insulative housing when the cover is in said first position.

3. The surface mount electrical connector of claim 1, wherein the arm further includes a pivot hole between the catch mechanism and the tappet, and wherein the cover includes a sidewall having a pivot pin seated in the pivot hole for pivotally coupling the arm to the sidewall.

4. The surface mount electrical connector of claim 3, wherein a slot is defined by an opening between the sidewall and the insulative housing, and wherein the catch mechanism engages the slot for fastening the cover to the insulative housing when in the first position.

5. The surface mount electrical connector of claim 4, wherein the tappet touches said vertical guide mounted to the back plane when the c over is moved to the second position, there by causing the arm to rotate about the pivot pin and disengage from the slot.

6. The surface mount electrical connector of claim 5, wherein the arm rotates until the pivot pin touches the vertical guide, thereby causing the cover to move and subsequently expose the contact regions.

7. A surface mount electrical connector assembly comprising:

a) a back plane having a plurality of signal pads disposed thereon;

b) a daughter card having an edge;

c) at least one surface mount electrical connector comprising i) an insulative housing having a lower surface, mounted to the edge of the daughter card, ii) a plurality of conductive members passing through the insulative housing, the conductive members having contact regions on the lower surface of the insulative housing for making electrical contact with the signal pads on the back plane, said back plane having a vertical guide extending upwardly thereon iii) a cover movably mounted to the insulative housing, the cover being mounted to enclose the contact regions when in a first position, and to expose the contact regions when moved to a second position, and iv) an arm pivotally mounted to the cover, comprising a catch mechanism for fastening the cover to the insulative housing when in the first position, and a tappet being pushed by said vertical guide for allowing for causing the catch mechanism to unfasten the cover from the insulative housing, thereby allowing the cover to move to the second position.

* * * * *